US008697339B2

(12) United States Patent
Zhuang et al.

(10) Patent No.: US 8,697,339 B2
(45) Date of Patent: Apr. 15, 2014

(54) SEMICONDUCTOR DEVICE MANUFACTURING METHODS

(75) Inventors: Haoren Zhuang, Hopewell Junction, NY (US); Chong Kwang Chang, Suwon (KR); Alois Gutmann, Poughkeepsie, NY (US); Jingyu Lian, Hopewell Junction, NY (US); Matthias Lipinski, Poughkeepsie, NY (US); Len Yuan Tsou, New City, NY (US); Helen Wang, LaGrangeville, NY (US)

(73) Assignees: International Business Machines Corporation, Armonk, NY (US); Samsung Electronics Co., Ltd., Suwon-Si, Gyeonggi-Do (KR); Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/081,377

(22) Filed: Apr. 6, 2011

(65) Prior Publication Data

US 2011/0183266 A1 Jul. 28, 2011

Related U.S. Application Data

(63) Continuation of application No. 11/804,528, filed on May 18, 2007, now abandoned.

(51) Int. Cl.
*G03F 7/20* (2006.01)
(52) U.S. Cl.
USPC .......................................................... 430/312
(58) Field of Classification Search
USPC ..................................... 430/311, 312, 313, 394
See application file for complete search history.

(56) References Cited

U.S. PATENT DOCUMENTS

| | | | |
|---|---|---|---|
| 6,270,948 B1 | 8/2001 | Sato et al. | |
| 6,787,469 B2 | 9/2004 | Houston et al. | |
| 2003/0153193 A1 | 8/2003 | Fuse et al. | |
| 2004/0132225 A1* | 7/2004 | Chung et al. | 438/22 |
| 2004/0266203 A1* | 12/2004 | Hwang et al. | 438/706 |
| 2005/0009358 A1 | 1/2005 | Choi et al. | |
| 2005/0106882 A1* | 5/2005 | Chao et al. | 438/700 |
| 2006/0046205 A1 | 3/2006 | Hah et al. | |
| 2006/0166108 A1* | 7/2006 | Chandrachood et al. | 430/5 |
| 2006/0292876 A1 | 12/2006 | Naito | |
| 2008/0009138 A1* | 1/2008 | Lee | 438/703 |
| 2008/0023751 A1* | 1/2008 | Joshi et al. | 257/324 |
| 2008/0079155 A1* | 4/2008 | Mule et al. | 257/751 |

OTHER PUBLICATIONS

Zhuang, H., et al., "Patterning Strategies for Gate Level Tip-Tip Distance Reduction in SRAM Cell for 45nm and Beyond," International Semiconductor Technology Conference (ISTC) 2007, Mar. 18-20, 2007, 2 pp., Electrochemical Society, Inc., Shanghai, China.

* cited by examiner

*Primary Examiner* — Brittany Raymond
(74) *Attorney, Agent, or Firm* — Slater & Matsil, L.L.P.

(57) ABSTRACT

Methods for manufacturing semiconductor devices are disclosed. One preferred embodiment is a method of processing a semiconductor device. The method includes providing a workpiece having a material layer to be patterned disposed thereon. A masking material is formed over the material layer of the workpiece. The masking material includes a lower portion and an upper portion disposed over the lower portion. The upper portion of the masking material is patterned with a first pattern. A polymer material is disposed over the masking material. The masking material and the polymer layer are used to pattern the material layer of the workpiece.

22 Claims, 16 Drawing Sheets

US 8,697,339 B2

SEMICONDUCTOR DEVICE MANUFACTURING METHODS

This is a continuation application of U.S. application Ser. No. 11/804,528, entitled, "Semiconductor Device Manufacturing Methods," which was filed on May 18, 2007 now abandoned and which is hereby incorporated herein by reference.

TECHNICAL FIELD

The present invention relates generally to the fabrication of semiconductor devices, and more particularly to the fabrication of transistors and other features.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon.

Optical photolithography involves projecting or transmitting light through a pattern made of optically opaque areas and optically clear areas on a lithography mask or reticle. For many years in the semiconductor industry, optical lithography techniques such as contact printing, proximity printing, and projection printing have been used to pattern material layers of integrated circuits. In optical lithography, lens projection systems and transmission lithography masks are used for patterning, wherein light is passed through the lithography mask to impinge upon a photosensitive material layer disposed on a semiconductor wafer or workpiece. The patterned photosensitive material layer is then used as a mask to pattern a material layer of the workpiece.

A transistor is an element that is utilized extensively in semiconductor devices. There may be millions of transistors on a single integrated circuit (IC), for example. A common type of transistor used in semiconductor device fabrication is a metal oxide semiconductor field effect transistor (MOSFET). A transistor typically includes a gate dielectric disposed over a channel region, and a gate formed over the gate dielectric. A source region and a drain region are formed on either side of the channel region within a substrate or workpiece.

A complementary metal oxide semiconductor (CMOS) device is a device that utilizes p channel metal oxide semiconductor (PMOS) field effect transistors (FETs) and n channel metal oxide semiconductor (PMOS) field effect transistors (FETs) in a complementary arrangement. One example of a memory device that uses both PMOS FETs and NMOS FETs is a static random access memory (SRAM) device. A typical SRAM device includes arrays of thousands of SRAM cells, with each SRAM cell having four or six transistors, for example. A commonly used SRAM cell is a six-transistor (6T) SRAM cell, which has two PMOS FETs interconnected with four NMOS FETs.

One challenge in transistor manufacturing processes is the patterning of the transistor gates. Reducing the final tip-to-tip (T2T) distance of gate conductor line ends in SRAM cells to the desired target values has become one of the major patterning challenges for CMOS technologies with smaller ground rules, for example. Limitations in optical resolution and space angle dependent variations in etch/redeposition processes may result in device features not printing in desired shapes or sizes. Efforts to compensate for line end shortening in patterned device structures by length corrections of corresponding mask features may be restricted by geometrical limitations on the mask or limited resolution capability of the exposure tool.

Thus, what are needed in the art are improved methods of patterning transistor gates and other features of semiconductor devices.

SUMMARY OF THE INVENTION

These and other problems are generally solved or circumvented, and technical advantages are generally achieved, by preferred embodiments of the present invention, which provide novel methods of reducing tip-to-tip distance between features by optimizing lithography and reactive ion etch (RIE) processes.

In accordance with a preferred embodiment of the present invention, a method of processing a semiconductor device includes providing a workpiece having a material layer to be patterned disposed thereon. A masking material is formed over the material layer of the workpiece. The masking material includes a lower portion and an upper portion disposed over the lower portion. The upper portion of the masking material is patterned with a first pattern. An additional substance is introduced and the lower portion of the masking material is patterned. The masking material and the additional substance are used to pattern the material layer of the workpiece.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The present invention will be described with respect to preferred embodiments in a specific context, namely in the patterning of transistor gates of SRAM devices. The invention may also be applied, however, to the patterning of other features of semiconductor devices, particularly features having a repeating pattern, wherein positioning the features closer together in a controlled manner is desired. Embodiments of the invention may also be implemented in other semiconductor applications such as other types of memory devices, logic devices, mixed signal devices, and other applications, as examples.

Reducing the tip-to-tip distance between transistor gates is a key challenge for achieving high density, particularly in applications such as SRAM devices. Both a small pitch (e.g., between elongated edges) and small tip-to-tip distance (e.g., between short edges) between adjacent gates are required in some designs. However, there are limitations in existing lithography capabilities in printing small tip-to-tip distances. In some etch processes, the etch process itself contributes to a line end shortening effect, for example.

Embodiments of the present invention provide methods for reducing etch-related line end shortening effects. The size of the features is made slightly larger using several methods or combinations thereof, to be described further herein, resulting in reducing the space between the features. In some embodiments, the size of the features is slightly enlarged by the selection of the gas chemistries used to open an anti-reflective coating (ARC) disposed beneath a layer of photosensitive material, resulting in a redeposition of etch-protective material on the sidewalls of the ARC, which slightly enlarges features formed in a material layer and reduces the space between features. In other embodiments, the size of the features is slightly enlarged by the introduction of a polymer material after the patterning of the photoresist but before the opening of the anti-reflective coating. The polymer material coats the patterned photosensitive material sidewalls, making the patterns formed in the anti-reflective coating and the patterned material layer slightly larger and also reducing the space between the features.

Figure 1:
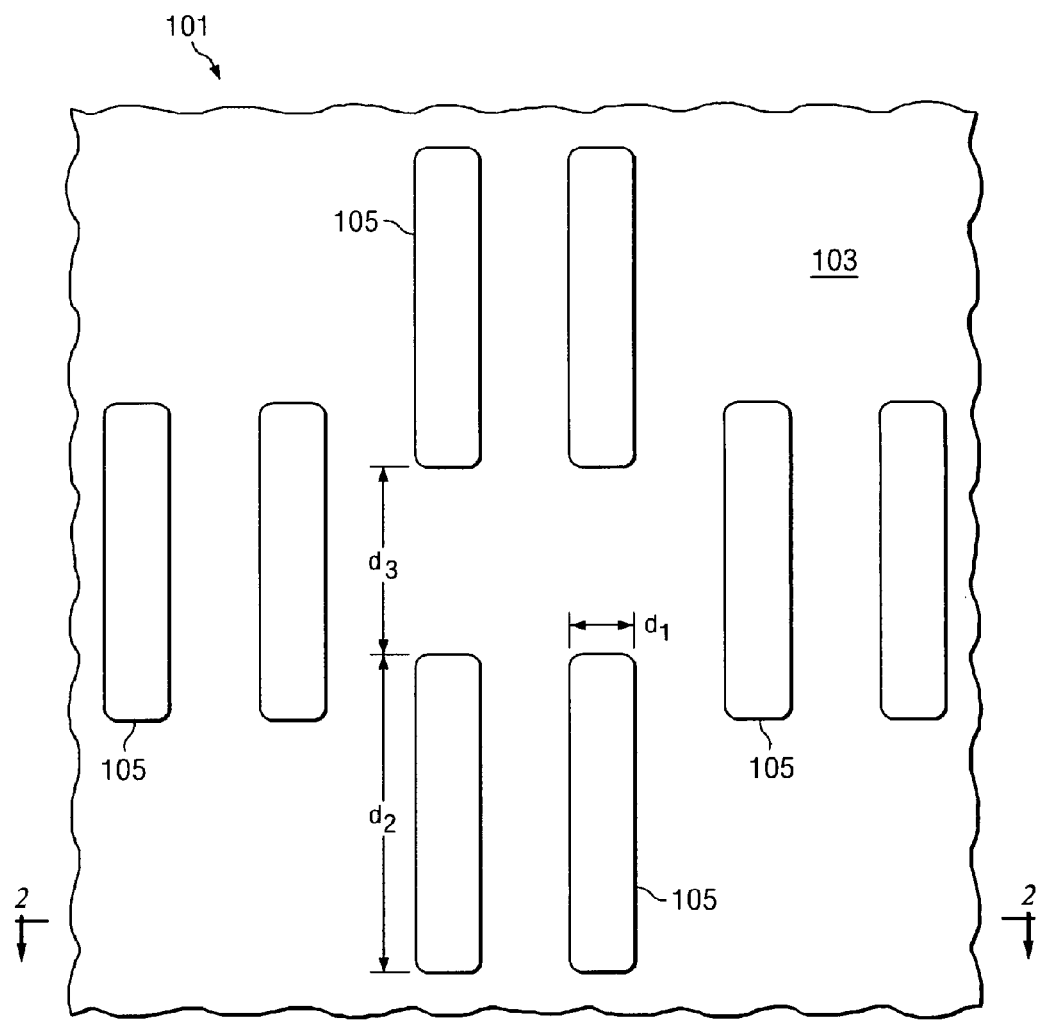
FIG. 1 shows a top view of a lithography mask in accordance with a preferred embodiment of the present invention, having a pattern for a plurality of transistor gates formed thereon.

A first preferred embodiment of the present invention will be described with reference to FIGS. 1 through 7, in which an etch chemistry used to open an anti-reflective coating is selected that has a redeposition component during the etch process. Referring first to FIG. 1, a lithography mask 101 is shown in a top view. The lithography mask 101 comprises a bright field binary mask that includes a substantially opaque material 105 attached or coupled to a substantially transparent material 103. The substantially opaque material 105 preferably comprises a material that is opaque to light or energy, such as chromium or other opaque material. The substantially transparent material 103 preferably comprises a transparent material such as quartz or glass, although other materials may also be used. The lithography mask 101 may also comprise an alternating phase shift mask, an attenuating mask, a dark field mask, or other types of masks, as examples, not shown.

The opaque material 105 of the lithography mask 101 in accordance with a preferred embodiment of the present invention comprises a pattern for a plurality of transistor gates formed thereon. The pattern preferably comprises a plurality of opaque features formed in the opaque material 105. The patterns for the features comprised of the opaque material 105 are preferably arranged in a plurality of rows and columns, as shown in FIG. 1. The patterns for the features may comprise a plurality of opaque substantially rectangular shapes having rounded ends, or the feature patterns may comprise other shapes, such as a plurality of square, round, elliptical, triangular, rectangular, polygonal, or trapezoidal features. Alternatively, the patterns for the features in the opaque material 105 may also comprise other shapes, for example. The rows and columns of the feature patterns may be staggered, e.g., in alternating rows or columns in pairs, as shown, staggered singularly (not shown), or alternatively, the feature patterns may be aligned singularly or in pairs (see FIG. 8) in rows and columns. The pattern features may also be arranged in other configurations, for example.

In some embodiments, the patterns for the features preferably comprise a width (e.g., dimension $d_1$) along at least one side comprising a minimum feature size of the lithography system the manufacturing process will be used in, and the patterns for the features may be spaced apart by the same minimum feature size, as an example. The width $d_1$ and spaces may also comprise dimensions greater than the minimum feature size, alternatively. The patterns for the features in the opaque material 105 comprise a length represented by dimension $d_2$. The length-wise ends of the patterns for the features in the opaque material 105 are separated from adjacent patterns for features by a tip-to-tip dimension represented by dimension $d_3$. The patterns for the corresponding features on the semiconductor device, after being multiplied by the demagnification (reduction) factor of the exposure tool, which is generally 4, as an example (although exposure tools with other reduction factors or 1:1 ratios may also be used), may comprise a width or dimension $d_1$ of about 100 nm or less, a length or dimension $d_2$ of about 500 nm or less, and a tip-to-tip distance or dimension $d_3$ of about 150 nm or less in some applications, as examples, although the patterns for the features in the opaque material 105 of the mask 101 may also comprise other dimensions.

Note that the patterns for features in the opaque material 105 of the lithography mask 101 may also include small protrusions or serifs along their length or at their ends, for optical proximity correction (OPC) in the lithography process, for example, not shown. The OPC structures are not printed on a material layer during a lithography process, but rather, accommodate at least partially for diffraction effects in the lithography process and system.

Figure 2:
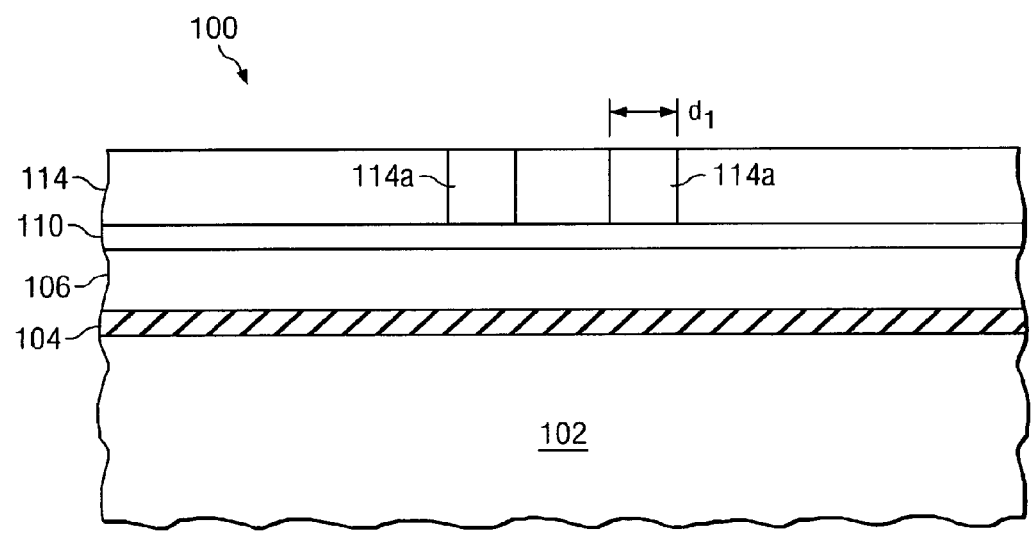
FIGS. 2 through 6 show cross-sectional views of a method of patterning a plurality of gates using the lithography mask of FIG. 1 in accordance with a preferred embodiment of the present invention.

FIGS. 2 through 6 show cross-sectional views of a method of patterning a plurality of transistor gates using the lithography mask 101 of FIG. 1 in accordance with a preferred embodiment of the present invention, wherein an anti-reflective coating open etch step is optimized to control the amount of line end shortening. FIG. 2 illustrates a cross-sectional view of a semiconductor device 100 patterned using the lithography mask 101 at "2-2" in FIG. 1, for example.

To manufacture a semiconductor device 100 using the lithography mask 101 of FIG. 1, first, a workpiece 102 is provided. The workpiece 102 may include a semiconductor substrate comprising silicon or other semiconductor materials covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) substrate, for example.

A material layer 104/106 to be patterned is formed over the workpiece 102. The material layer 104/106 may comprise a gate dielectric material 104 disposed over the workpiece 102 and a gate material 106 disposed over the gate dielectric material 104, as examples, although alternatively, the material layer 104/106 may comprise other materials. The gate dielectric material 104 may comprise an insulating material such as silicon dioxide, silicon nitride, a high dielectric constant (k) material, or combinations or multiple layers thereof, as examples. The gate dielectric material 104 may comprise a thickness of about 300 Angstroms or less, for example. The gate material 106 may comprise a semiconductive material such as polysilicon or a conductor such as a metal, or combinations or multiple layers thereof, as examples. The gate material 106 may comprise a thickness of about 2,000 Angstroms or less, for example. Alternatively, the gate dielectric material 104 and the gate material 106 may comprise other materials and dimensions. The material layer 104/106 may also include an optional hard mask disposed over the gate material 106, for example, not shown. The material layer 104/106 may comprise a nitride material layer disposed proximate a top surface thereof that is used as a mask for a later etch process, as another example, also not shown.

A masking material 110/114 is formed over the material layer 104/106 to be patterned, as shown in FIG. 2. The masking material 110/114 preferably comprises an anti-reflective coating 110 disposed over the material layer 104/106, and a layer of photosensitive material 114 disposed over the anti-reflective coating 110. The anti-reflective coating 110 is also referred to herein as a lower portion 110 of the masking material 110/114. The anti-reflective coating 110 may comprise an organic material, for example, although other materials may also be used. The masking material 110/114 may include an optional organic dielectric layer (ODL) also comprising an organic material disposed beneath the anti-reflective coating 110 in embodiments, not shown. The layer of photoresist 114 is also referred to herein as an upper portion 114 of the masking material 110/114, for example.

The upper portion 114 of the masking material 110/114 is patterned with a first pattern, as shown at 114a, using the lithography mask 101 shown in FIG. 1. The first pattern comprises substantially the same shape as the pattern in the opaque material 105 of the lithography mask (e.g., before OPC structures are added to the mask 101), for example. The first pattern may exhibit line shortening of pattern features of the lithography mask 101 in some embodiments, for example. The masking material 110/114 is exposed to light or energy through or reflected from the mask 101 to expose portions of the layer of photoresist 114 not protected by the mask 101, leaving portions 114a of the layer of photoresist 114 unexposed. The layer of photoresist 114 is then developed, and exposed portions of the layer of photoresist 114 are etched away, as shown in FIG. 3.

Figure 3:
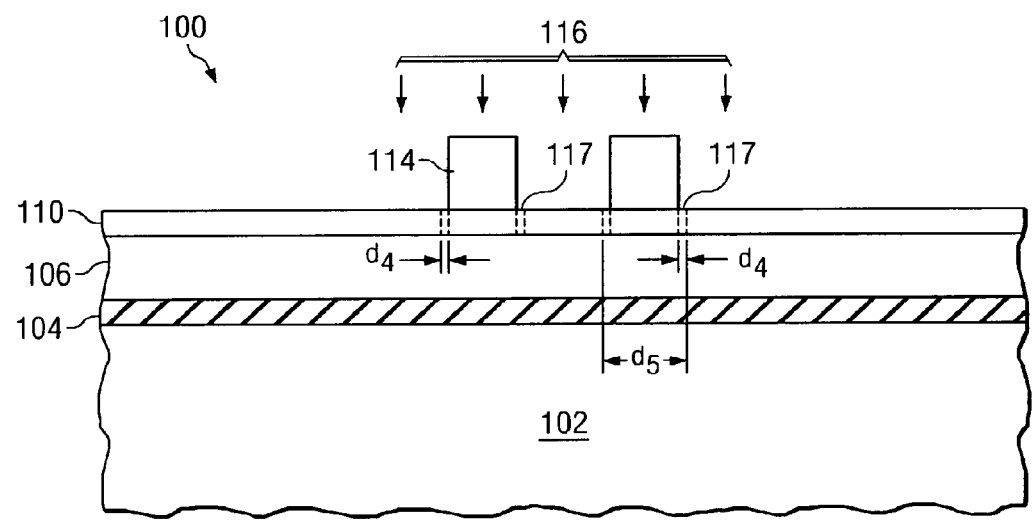
Figure 4:
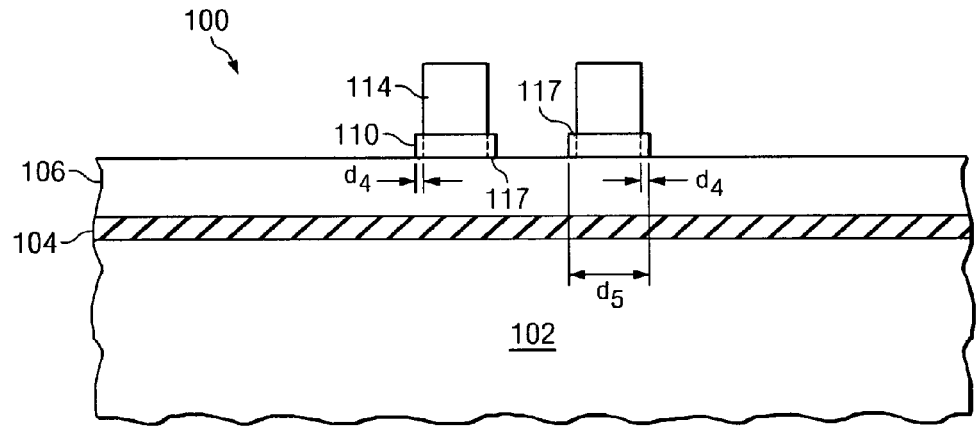

Next, an additional substance is introduced and the lower portion 110, e.g., the anti-reflective coating 110 of the masking material 110/114 is patterned or opened using an etch process 116, as shown in FIG. 3. In this embodiment, the additional substance 117 that is introduced comprises a by-product of the etch process 116 used to pattern the lower portion of the masking material 110. The etch process 116 preferably comprises a reactive ion etch (RIE) process that preferably comprises a redeposition component 117 (e.g., also referred to herein as an additional substance 117) that redeposits, lines, or forms on sidewalls of the anti-reflective coating 110 as the anti-reflective coating 110 is etched away, for example. The semiconductor device 100 is shown in FIG. 4 after the etch process 116 for the anti-reflective coating 110 is completed.

The redeposition component 117 may comprise a dimension $d_4$ of about 20 nm or less of a material such as a polymer material. The redeposition component 117 preferably comprises a polymer, and may comprise C—F—O—Si, or a material comprising C, F, O, Si, or combinations thereof, as examples. Alternatively, the redeposition component 117 may also comprise other dimensions and materials. The redeposition component 117 preferably comprises a material that is resistant to the etch chemistries that are used later to pattern the material layer 104/106, for example.

The etch process 116 is preferably selected to achieve a desired material type and thickness of the redeposition component 117, in accordance with embodiments of the present invention. For example, in a preferred embodiment, a pure carbon fluorine oxygen ($CF_4/O_2$) gas chemistry is used as the gas chemistry for the etch process 116. In another preferred embodiment, $CF_4/CH_2F_2/O_2$ may be used for the etch process 116, as another example. Alternatively, other gas chemistries may be used for the etch process 116, such as other carbon-fluorine-oxygen gas chemistries or other gas chemistries.

Figure 5:
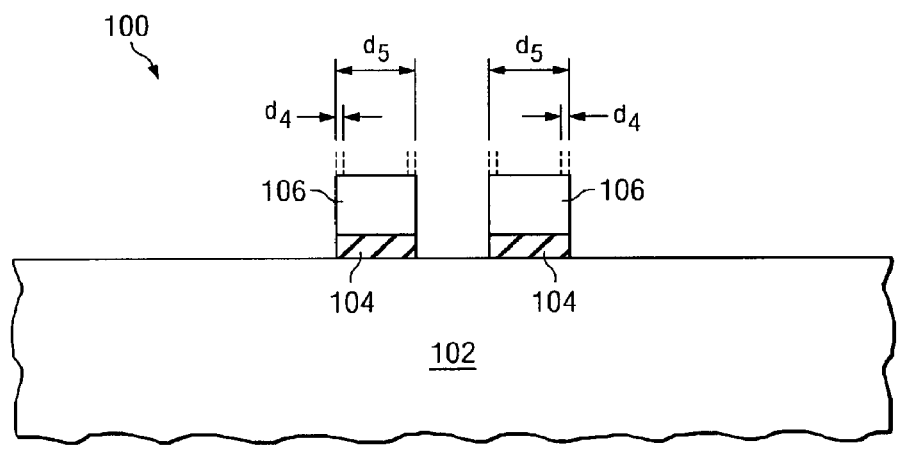

The material layer 104/106 is then patterned using the layer of photoresist 114, the additional substance 117, the optional ODL if present, and the anti-reflective coating 110 as a mask, while exposed portions of the material layer 104/106 are etched away. A portion of or the entire layer of photoresist 114 may be consumed or removed during the etch process to pattern the material layer 104/106, as shown in FIG. 5. Any remaining anti-reflective coating 110 and photoresist 114 are then removed.

The pattern formed in the material layer 104/106 comprises a second pattern, wherein the second pattern is larger than the first pattern of the layer of photoresist 114. The second pattern may comprise a slight enlargement of the first pattern, for example. The enlarged second pattern may provide a slight enlargement of the first pattern to accommodate for line shortening during the transfer of the mask 101 pattern to the layer of photoresist 114, for example. Or, the second pattern may intentionally be slightly larger than the first pattern in order to reduce the tip-to-tip distance $d_8$ between adjacent features in the material layer 104/106, as another example, as shown in FIG. 6.

Because of the increased width, shown as dimension $d_5$ in FIGS. 4 and 5, of the anti-reflective coating 110 by the width or dimension $d_4$ of the additional substance or redeposition component 117, the width of the features formed in the material layer 104/106 also comprises a width or dimension $d_5$, as shown in FIG. 5. The widths (dimension $d_5$) of the features formed in the material layer 104/106 are shown, which are slightly larger that the widths (dimension $d_1$) of the feature patterns of the lithography mask 101 in FIG. 1, e.g., by an amount $d_4$ on either side.

Note that the material layer 104/106 may comprise a single layer of material rather than two material layers 104 and 106, as shown. Furthermore, only the gate material 106 may be patterned using the methods described herein, leaving the gate dielectric material 104 unpatterned (not shown). The gate dielectric material 104 may be patterned in a later manufacturing step in these embodiments, for example.

Figure 6:
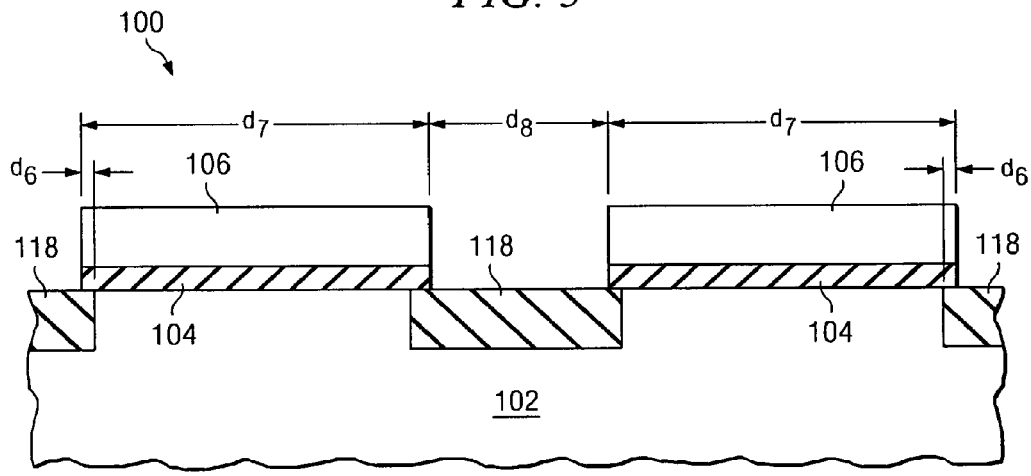
Figure 7:
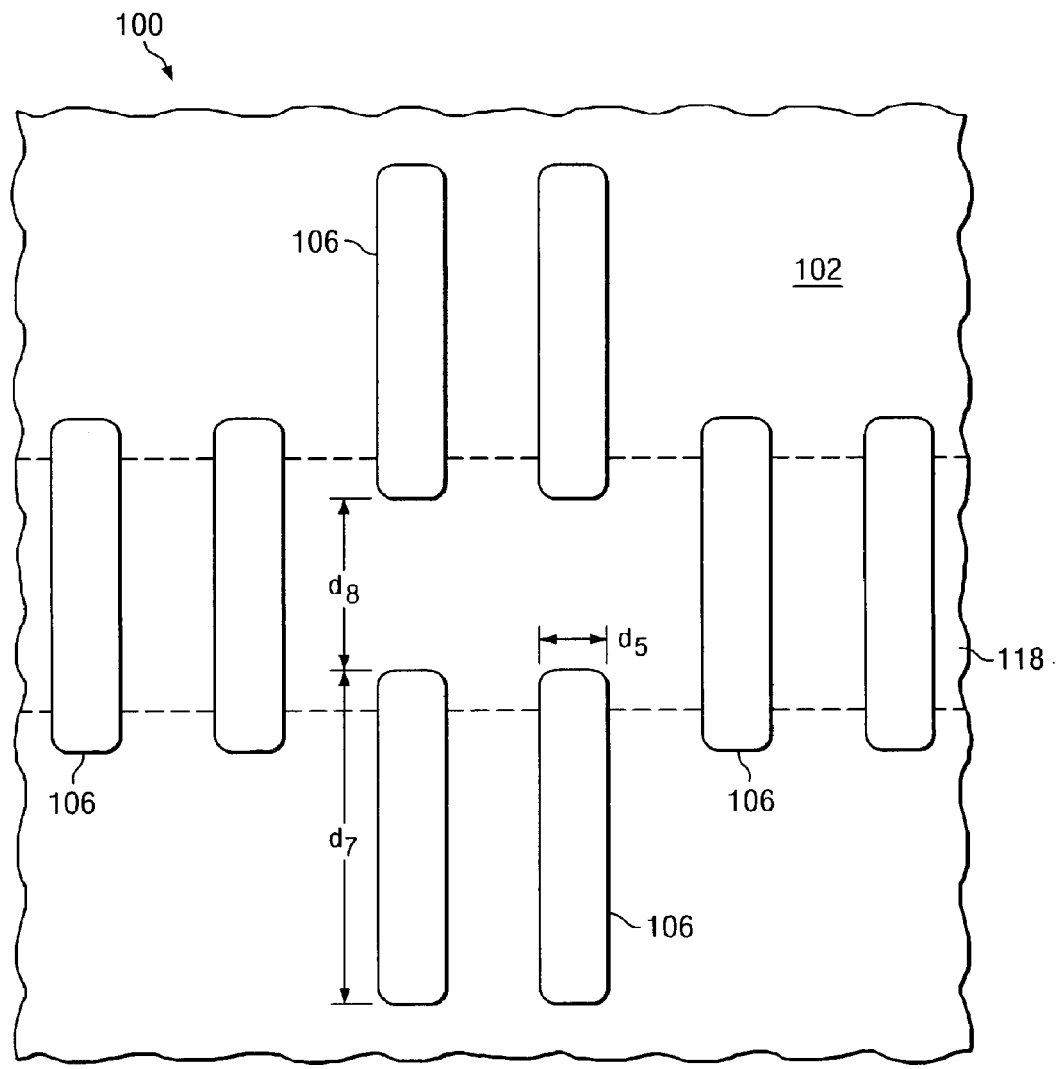
FIG. 7 shows a top view of a semiconductor device that has been patterned using the lithography mask of FIG. 1 and the method illustrated in FIGS. 2 through 6.

In FIG. 6, a cross-sectional view of the semiconductor device 100 of FIG. 5 is shown rotated by ninety degrees. FIG. 7 shows a top view of a semiconductor device 100 that has been patterned using the lithography mask 101 of FIG. 1 and the method illustrated in FIGS. 2 through 6. The lengths (dimension $d_7$) of the features formed in the material layer 104/106 are shown in FIGS. 6 and 7. The lengths (dimension $d_7$) of the features are slightly larger than the lengths (dimension $d_2$) of the feature patterns on the mask 101, e.g., by an amount $d_6$ on either side. Note that isolation regions 118, which may comprise shallow trench isolation (STI) or other type of isolation structures, are also shown in FIG. 6 and in FIG. 7 in phantom. The amount of overlap of transistor gates (e.g., features formed in the gate material 106) with isolation regions 118 and/or active areas can be a critical dimension in a semiconductor device 100 design, for example, and embodiments of the present invention provide increased control of such overlaps with underlying structures, and a reduction of the line shortening effect on patterned features.

Advantageously, the features formed in the material layer 104/106 are spaced apart by a decreased amount or tip-to-tip dimension $d_8$, as shown in FIG. 6. Because the ends of the features have been lengthened by amount $d_6$ (see FIG. 5) due to the novel redeposition component or additional substance 117 of the etch process 116, the tip-to-tip dimension $d_8$ is decreased compared with the tip-to-tip dimension $d_3$ of the pattern on the mask 101, forming a more dense array of transistor gates 106, for example.

Experimental results show that due to the shape of the feature patterns of the lithography mask 101 and due to the nature of the etch process used to pattern the material layer 104/106, narrower portions of the features (the width, $d_5$) may tend to not be increased in size as much as longer portions (the length, $d_7$) of the features are increased. For example, dimension $d_6$ of the amount of increase of the length $d_7$ of the features may be greater than dimension $d_4$ of the amount of increase of the width $d_5$, advantageously, in accordance with this embodiment of the present invention.

Table 1 shows experimental results after the novel optimization of the anti-reflective coating 110 open etch step of the first embodiment of the present invention for two SRAM cells, SRAM cell A and SRAM cell B, using two etch processes. The manufacturing method provides a high amount of leverage for minimizing etch-induced line end shortening. For example, Table 1 shows the variation of line width for polysilicon gates and tip-to-tip distance as a function of the ARC 110 open gas chemistry (e.g., for the etch process 116).

TABLE 1

|  | Develop CD | Final CD of Process A | Final CD of Process B |
|---|---|---|---|
| SRAM cell A |  |  |  |
| SRAM NFET | 107.5 | 92.1 | 75.9 |
| SRAM PFET | 106.4 | 95.1 | 80.1 |
| Tip-to-tip | 105.9 | 174.7 | 140.6 |
| Line end pull Back ratio (LEPBR) |  | 4.5 | 1.1 |
| SRAM cell B |  |  |  |
| SRAM NFET | 114.7 | 96.2 | 78.4 |
| SRAM PFET | 107.1 | 97.1 | 82.3 |
| Tip-to-tip | 89.5 | 161.5 | 130.2 |
| LEPBR |  | 3.9 | 1.1 |

Table 1 shows the line end pull-back ratio (LEPBR), i.e., the ratio of the final line end pull-back vs. the lateral critical dimension (CD) reduction/edge for two different gases chemistries used for the ARC open etch process 116, wherein process A comprised $CHF_3/HBr/He/O_2$ and process B comprised $CF_4/CH_2F_2/O_2$. In one experiment, a tip-to-tip distance difference resulting from the two processes resulted in a large difference of about 60 nm.

Line ends of features are more easily accessible to etching and also for polymer deposition, due to the comparatively larger space angle from which impinging species can arrive from the gas phase. By properly balancing the competing processes of etch attack and polymer material (e.g., of the redeposition component 117) deposition, LEPBR values of close to 1 can be obtained, as shown for process B. Note that the use of highly polymerizing etch processes may reduce the average trim amount (e.g., the litho-etch CD offset) and therefore may require an adjustment of the lithography CD target towards lower values, requiring improved resolution capability.

Moreover, the variation of the etch bias as a function of pitch may be effected. Etch bias data results from experiments indicated a similar through-pitch behavior for etch processes with a varying degree of polymer deposition. A gradual decrease in etch bias is observable with increasing pitch from the smallest pitch towards a pitch range around 400-500 nm, for example.

A reduction in tip-to-tip distance (e.g., dimension $d_8$ in FIGS. 6 and 7) of about 20 to 30 nm was achieved in experimental results by the proper selection of the ARC material 110 open etch process 116, advantageously. Also advantageously, experimental results show that the tip-to-tip dimension may be reduced faster than the line width increases using the first embodiment described herein, for example.

Thus, in accordance with the first embodiment of the present invention, patterns are made slightly larger by selecting an etch process 116 for opening the ARC material 110 that has a redeposition component 117 that slightly increases the size of the features patterned. In accordance with a second and third embodiment of the present invention, patterns are made slightly larger by an additional deposition process to form a thin material 220 (see FIG. 10) and 320 (see FIG. 18) over and lining a patterned portion of the masking material, to be described further herein.

A second embodiment of the present invention will be described next with reference to FIGS. 8 through 13. Like numerals are used for the various elements that were used to describe FIGS. 1 through 7. To avoid repetition, each reference number shown in FIGS. 8 through 13 is not described again in detail herein. Rather, similar materials x02, x04, x06, x08, etc. . . . are preferably used for the various material layers shown as were used to describe FIGS. 1 through 7, where x=1 in FIGS. 1 through 7 and x=2 in FIGS. 8 through 13.

Figure 8:
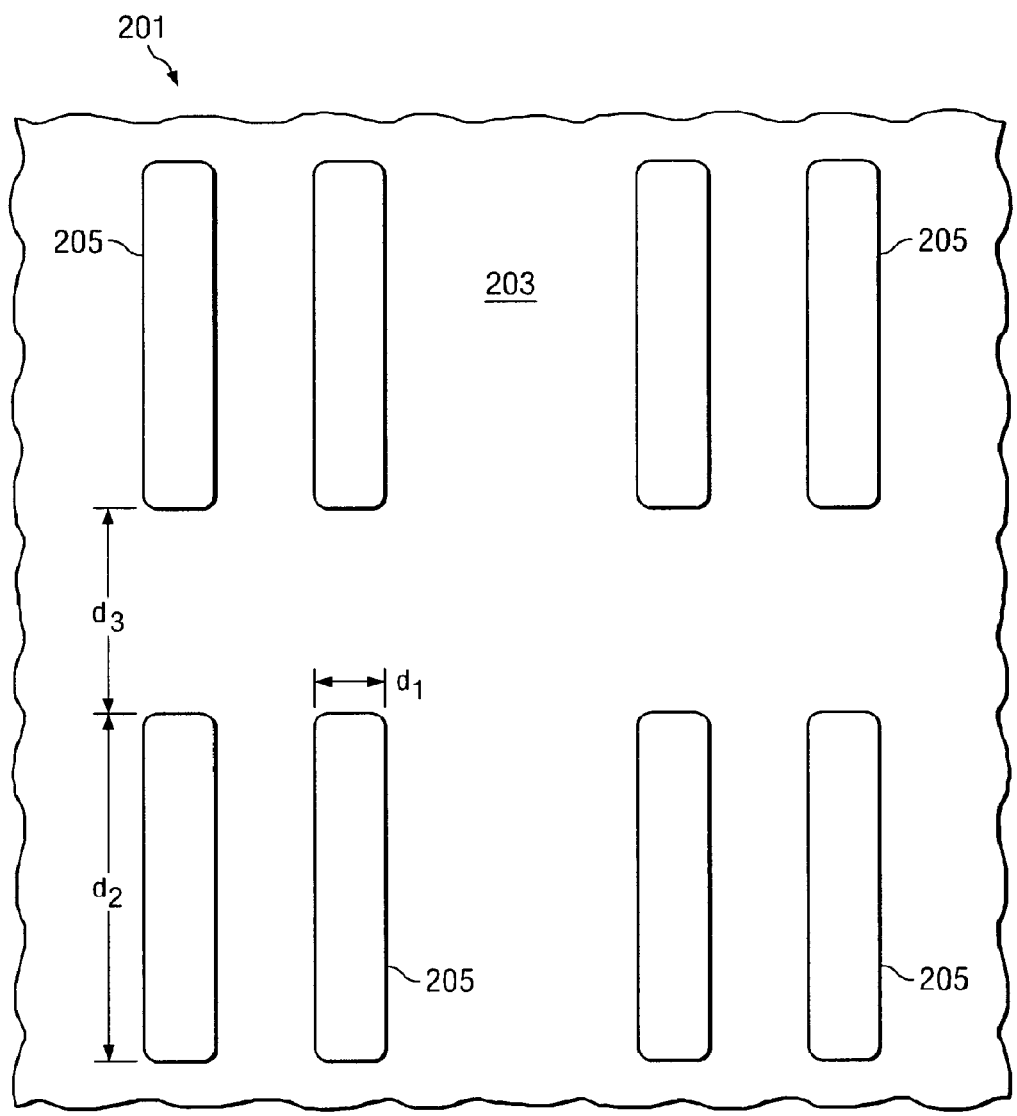
FIG. 8 shows a top view of a lithography mask in accordance with another preferred embodiment of the present invention.

A lithography mask 201 is shown in FIG. 8 comprising a pattern formed in an opaque material 205 of the mask 201 comprising rows and columns of pairs of gate patterns. The feature patterns comprise a width of dimension $d_1$, and length of dimension $d_2$, and a tip-to-tip distance between adjacent ends of dimension $d_3$.

Figure 9:
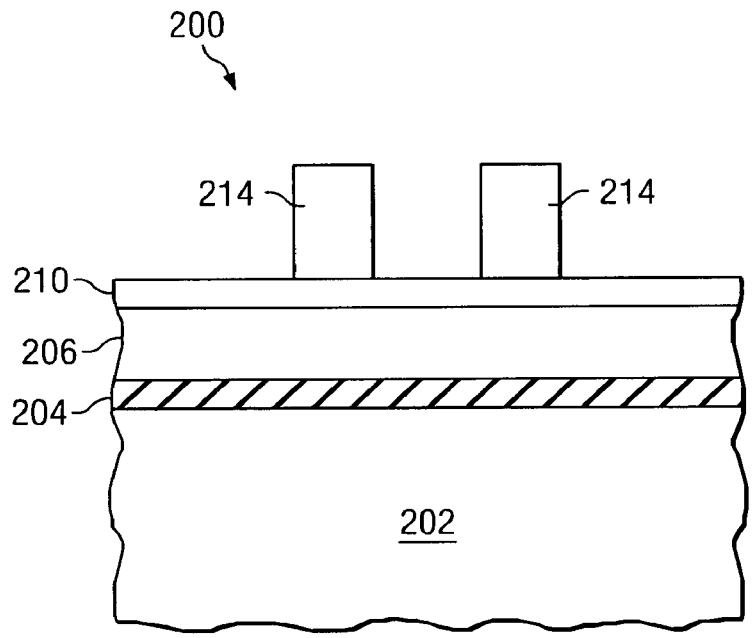
FIGS. 9 through 12 show cross-sectional views of a method of patterning a plurality of gates using the lithography mask of FIG. 8 in accordance with a preferred embodiment of the present invention.
Figure 10:
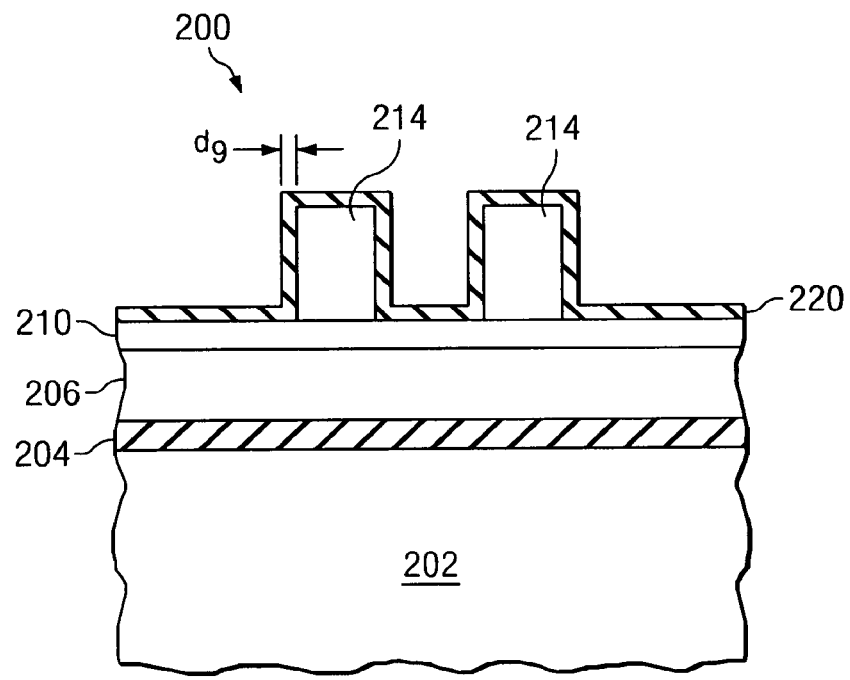

The lithography mask 201 is used to pattern an upper portion 214 of a masking material 210/214 formed over a material layer 204/206 of a semiconductor device 200, as shown in FIG. 9. An additional substance 220 is introduced, and the lower portion 210 of the masking material 210/214 is patterned. In this embodiment, the additional substance 220 preferably comprises a polymer material that is formed over the patterned upper portion of the masking material and over the lower portion of the masking material, before patterning the lower portion of the masking material 210, as shown in FIG. 10. The polymer material 220 is preferably conformally deposited, equally covering all exposed portions of the anti-reflective coating 210 and the patterned photosensitive material 214, as shown.

Figure 11:
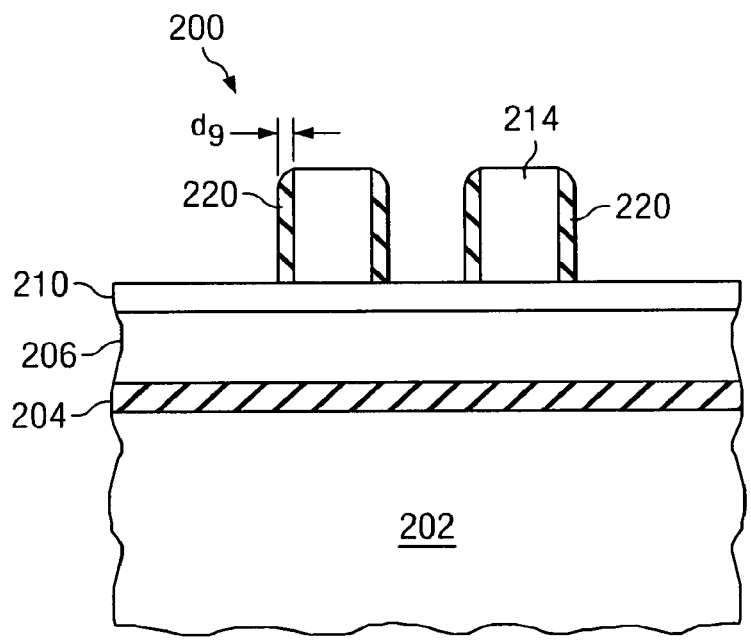

The polymer material 220 preferably comprises a material that is resistant to the etch process used to open or pattern the anti-reflective coating material 210, for example. The etch process for the anti-reflective coating 210 is preferably anisotropic, resulting in a portion of the polymer material 220 remaining on the sidewalls of the photosensitive material 214, as shown in FIG. 11. The polymer material 220 preferably comprises a thickness $d_9$ of about 20 nm or less in some embodiments, although alternatively, the polymer material 220 may comprise other dimensions. The polymer material 220 preferably comprises C—F—O—Si, or a material comprising C, F, O, Si, or combinations thereof, as examples, although other materials may also be used.

The polymer material 220 may be formed by introducing a gas such as $C_4F_8$, $C_xH_yF_z$, other C—F based gases, or other gases, to the etch chamber the semiconductor device 200 is being processed in, while applying a small bias power, e.g., about 20 to 50 Watts, although other levels of bias power may also be used, and turning on a plasma source, resulting in the formation of the polymer material 220, as an example. Alternatively, the polymer material 220 may be formed using deposition or growth methods, as examples.

Figure 12:
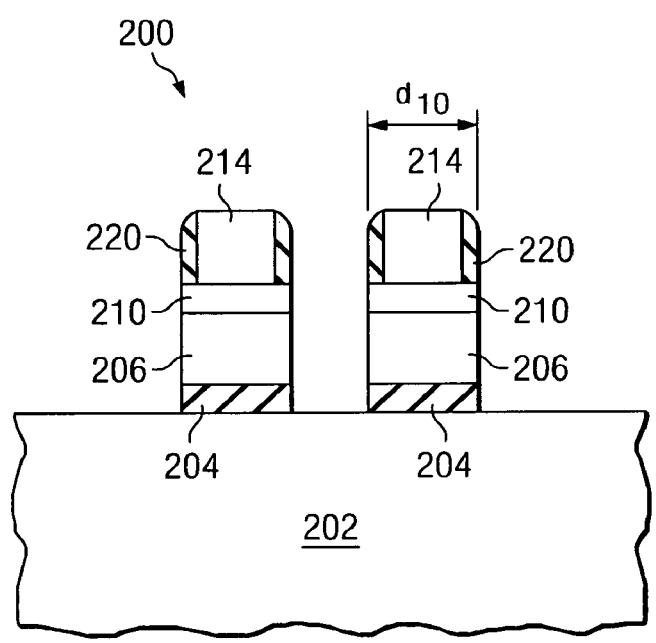

The masking material 210/214 and the polymer material 220 on the sidewalls of the photosensitive material 214 are used as a mask while portions of the material layer 204/206 are etched away, as shown in FIG. 12. The masking material 210/214 and the polymer material 220 are then removed. The etch process of the material layer 204/206 preferably comprises an anisotropic, directional etch process that results in a portion of the polymer material 220 being left remaining on the sidewalls of the photosensitive material 214 during the patterning of the underlying material layer 204/206, enlarging the pattern of the material layer 204/206 by the thickness of the polymer material 220 on all sides. The pattern of the material layer 204/206 comprises a width or dimension $d_{10}$ in the cross-sectional view shown in FIG. 12, wherein the dimension $d_{10}$ is greater than the width of the upper portion 214 of the masking material by about twice the amount of the thickness $d_9$ of the polymer material 220, for example.

Figure 13:
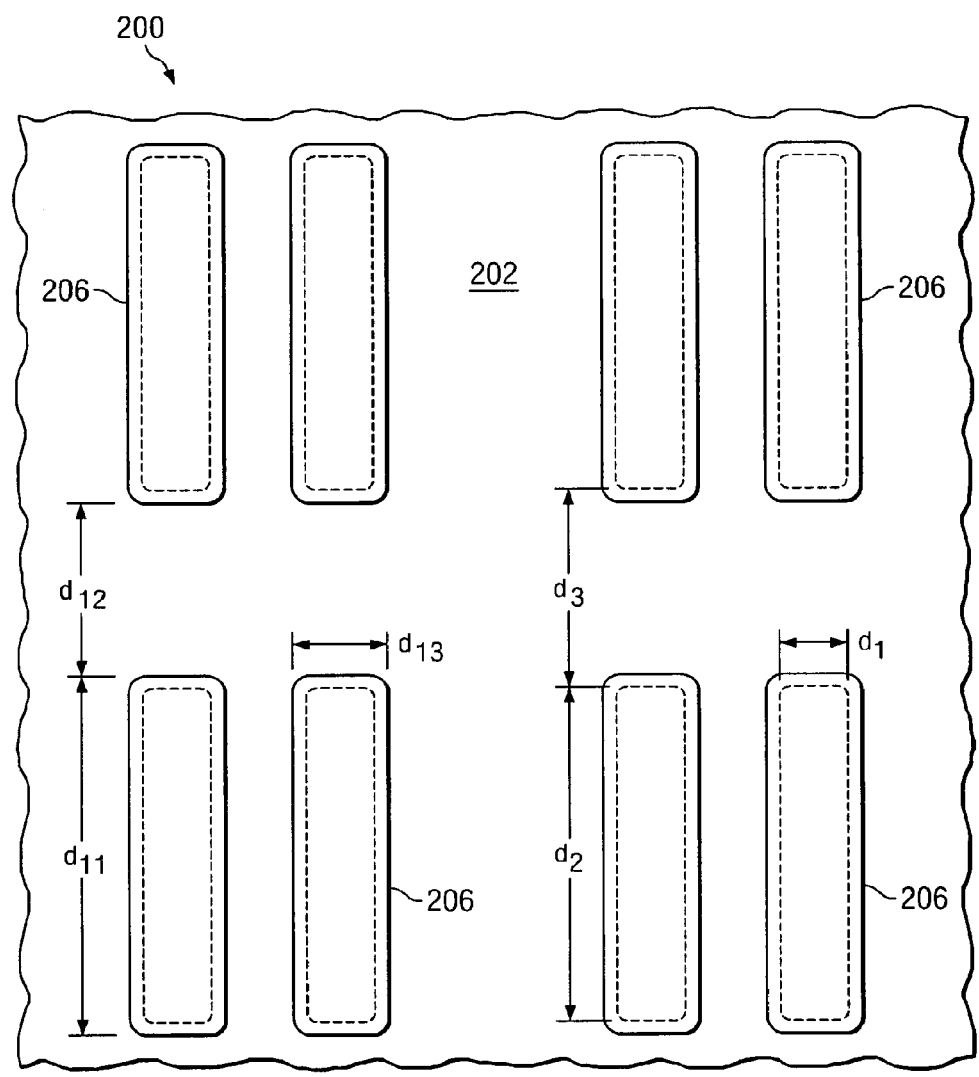
FIG. 13 shows a top view of a semiconductor device that has been patterned using the lithography mask of FIG. 8 and the method illustrated in FIGS. 9 through 12.

FIG. 13 shows a top view of a semiconductor device 200 patterned using the method shown in FIGS. 8 through 12, illustrating the patterned gate material 206. The patterned gate material 206 has an extended or greater length (dimension $d_{11}$) compared to the feature pattern length (dimension $d_2$) of the mask 201 shown in FIG. 8, e.g., divided by a reduction factor if other than a 1:1 mask and exposure tool is used. The patterned gate material 206 has a reduced or shortened tip-to-tip distance (dimension $d_{12}$) compared to the feature pattern tip-to-tip distance (dimension $d_3$) of the mask 201, divided by the reduction factor. The patterned gate material 206 also has an extended or greater width (dimension $d_{13}$) compared to the feature pattern width (dimension $d_1$) of the mask 201, due to the presence of the polymer material 220 on the sidewalls of the photosensitive material 214 during the etch process.

Thus, the second embodiment of the present invention provides another method of decreasing line end shortening and decreasing the tip-to-tip distance between features formed in a material layer 206. Furthermore, the second embodiment may also be combined with the first embodiment; for example, the polymer material 220 may be deposited over the patterned layer of photoresist 214, and an etch process such as the etch process 116 described for the first embodiment may be used that also forms a redeposition component 117 on the sidewalls of the anti-reflective coating 210 during the etching of the anti-reflective coating 210, further enlarging the features formed in the material layer 204/206.

Note that an optional ODL may be included in the masking material 210/214 in the second embodiment, e.g., disposed beneath the anti-reflective coating 210, not shown, e.g., if the masking material 210/214 comprises a tri-layer photoresist.

A third embodiment of the present invention will be described next with reference to FIGS. 14 through 21. Again, like numerals are used for the various elements that were described in FIGS. 1 through 7 and 8 through 13, and to avoid repetition, each reference number shown in FIGS. 14 through 21 is not described again in detail herein.

Figure 14:
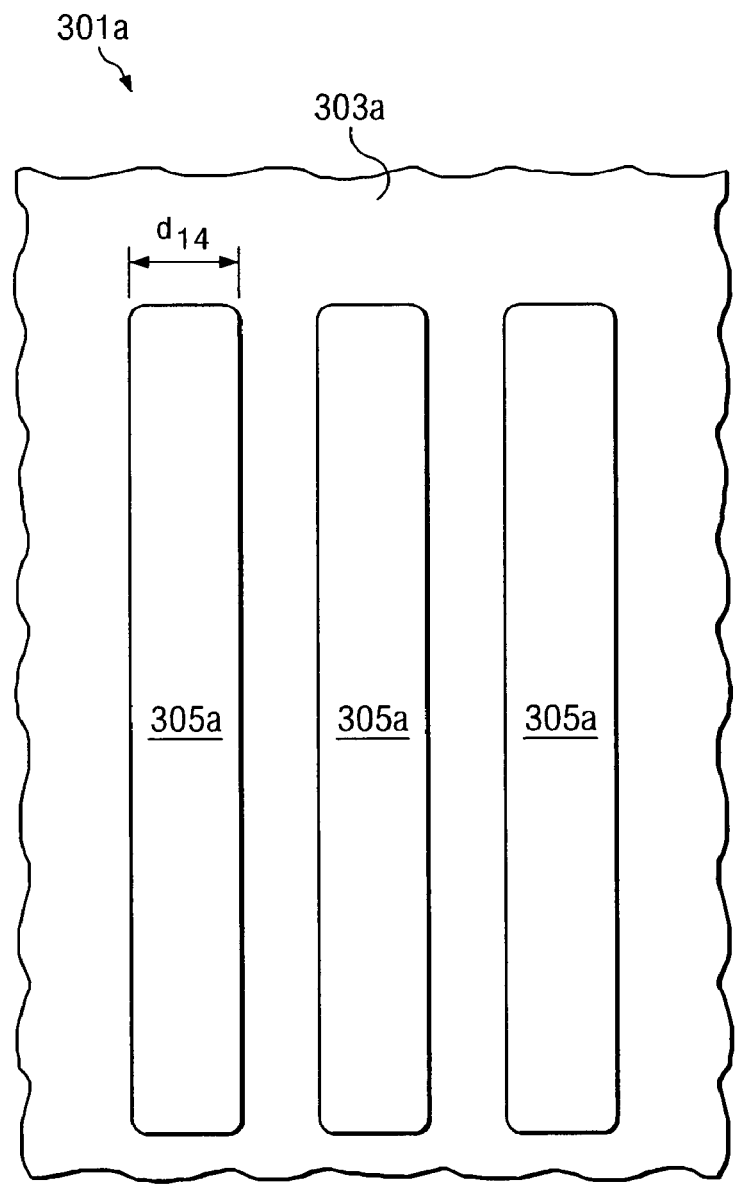
FIGS. 14 and 15 show top views of lithography masks in accordance with yet another preferred embodiment of the present invention.
Figure 15:
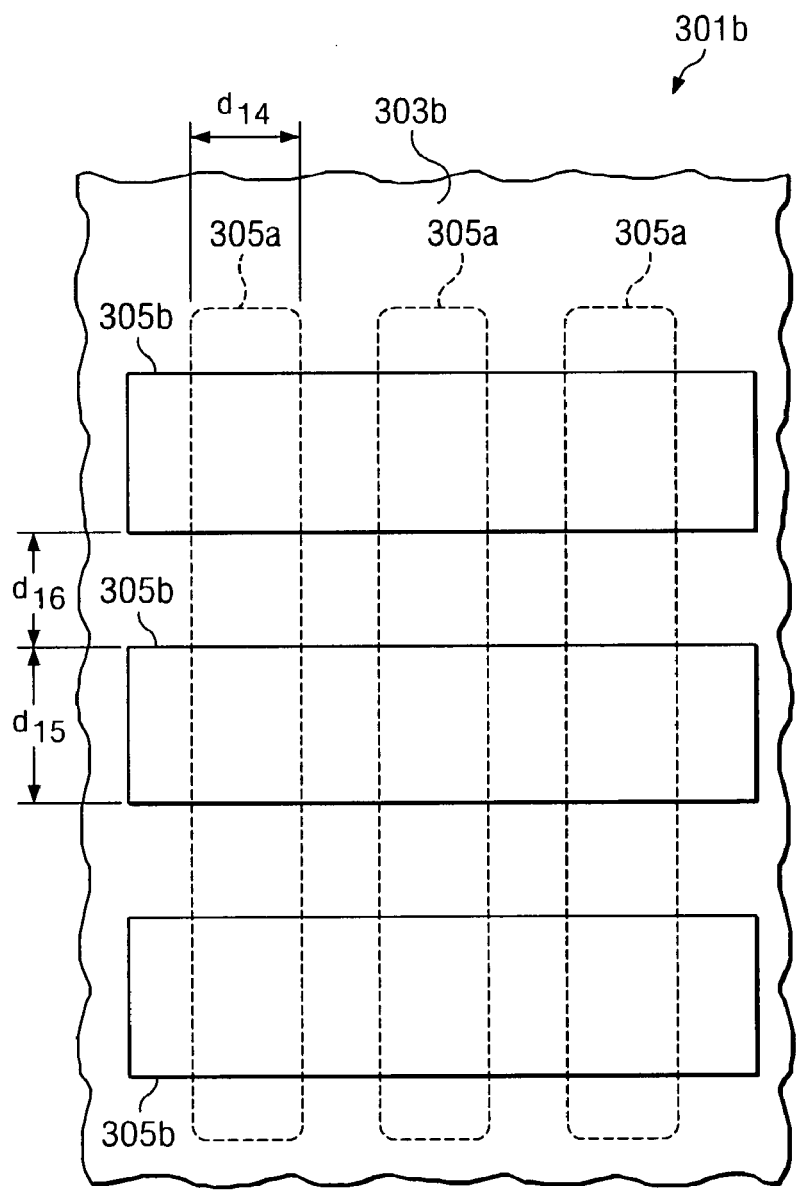

In this embodiment, a two step etch process is used to pattern the material layer 306, using two lithography masks and two masking material layers. FIGS. 14 and 15 show top views of lithography masks 301a and 301b in accordance with the third embodiment of the present invention. A first lithography mask 301a is shown in FIG. 14, and a second lithography mask 301b is shown in FIG. 15. The first lithography mask 301a may comprise a pattern 305a for lengthwise portions of gate electrodes, for example, defining the width (dimension $d_{14}$) of the gates but not the lengths. The second lithography mask 301b may comprise a "cutter mask" that is adapted to define the length (dimension $d_{15}$) of the gates, e.g., the ends of the gates in a lengthwise direction.

The patterns in the lithography masks 301a and 301b preferably comprise positive patterns in some embodiments, for example, wherein the patterns in the opaque material 305a and 305b represent regions where the gate material 306 will remain residing after the two-step etch process, at the intersections of the patterns in the opaque material 305a and 305b after the two-step etch process. Alternatively, the patterns may comprise negative patterns (not shown).

Again, the widths of the patterns 305a of the transistor width definition mask 301a comprise a dimension $d_{14}$. The widths of the patterns in the opaque material 305b of the cutter mask 301b that define the ends of the transistor gates, e.g., the length of the gates, comprise a dimension $d_{15}$. The tip-to-tip spacings on the mask 305b between line ends of the gate lengths comprise a dimension $d_{16}$.

Figure 16:
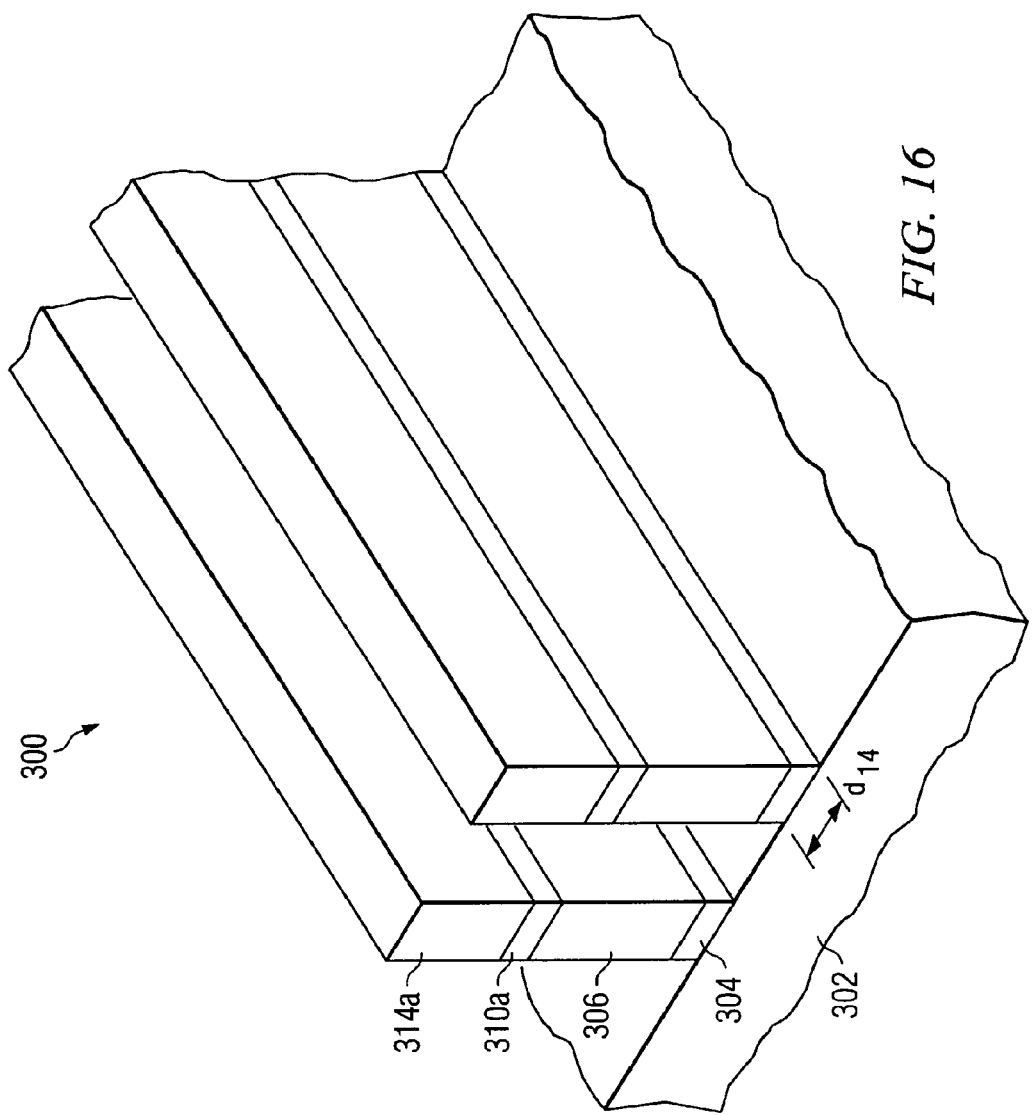
FIGS. 16 through 18 show perspective views of a method of patterning a plurality of gates using the lithography masks of FIGS. 14 and 15 in accordance with a preferred embodiment of the present invention.
Figure 17:
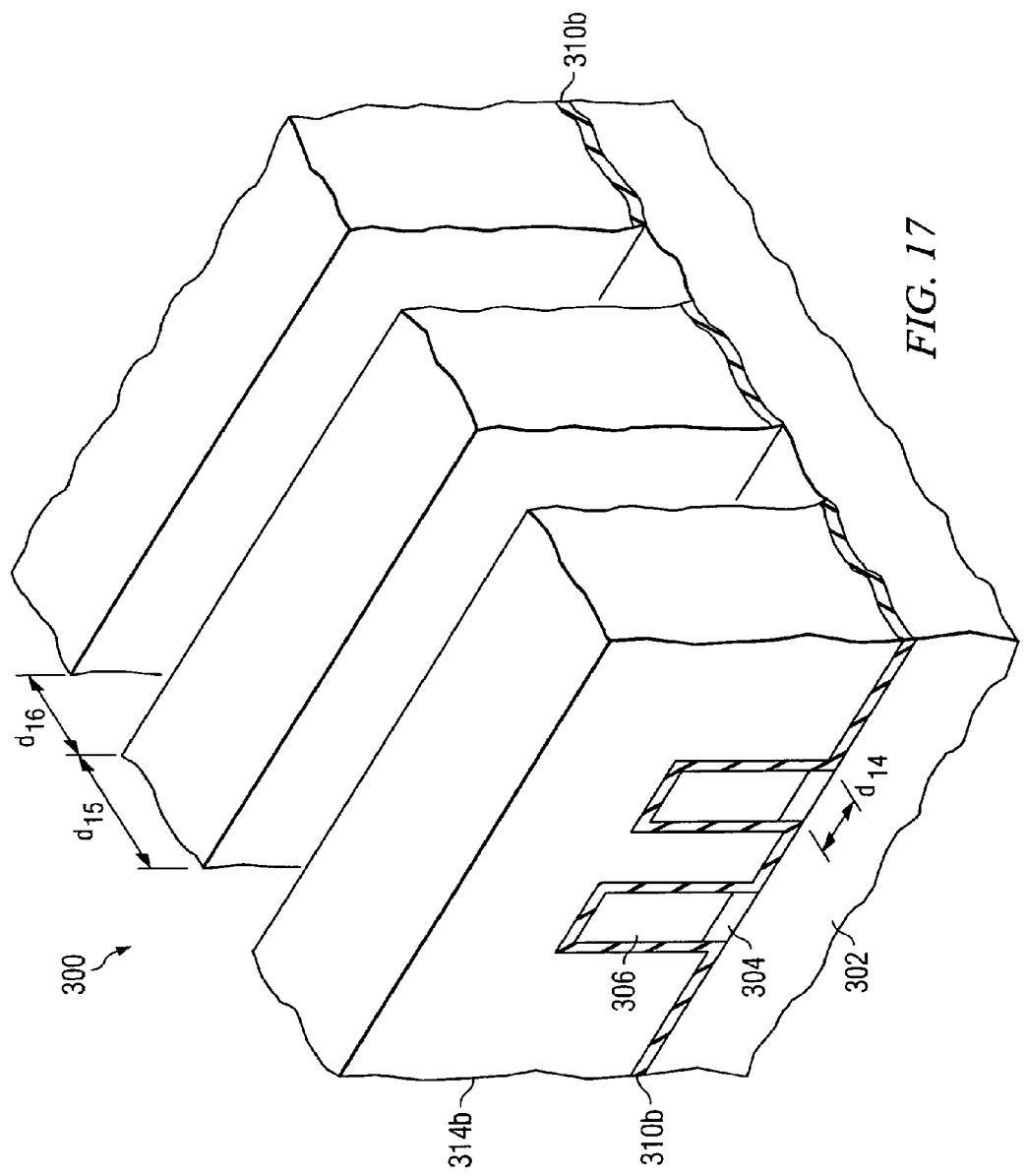
Figure 18:
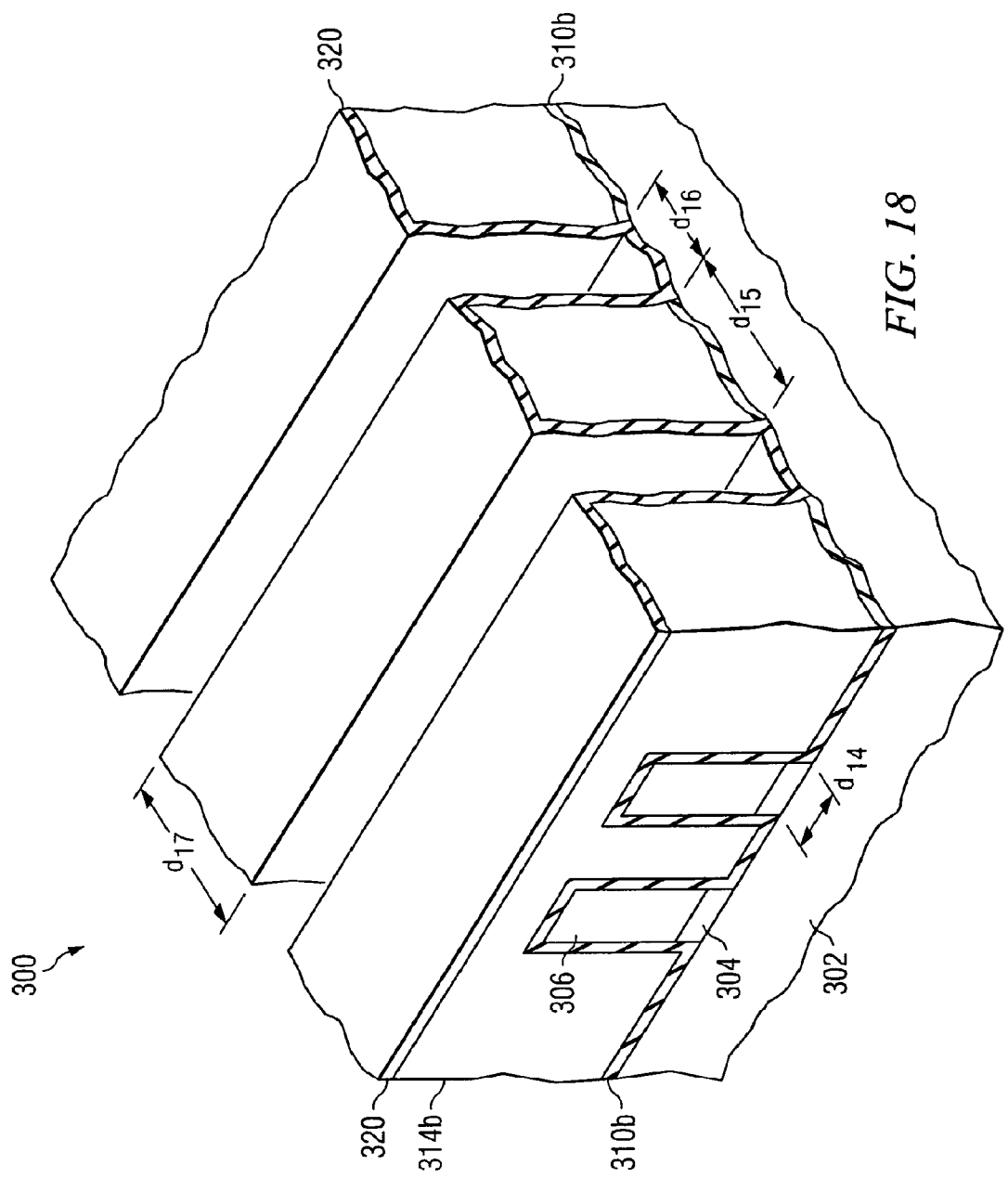
Figure 19:
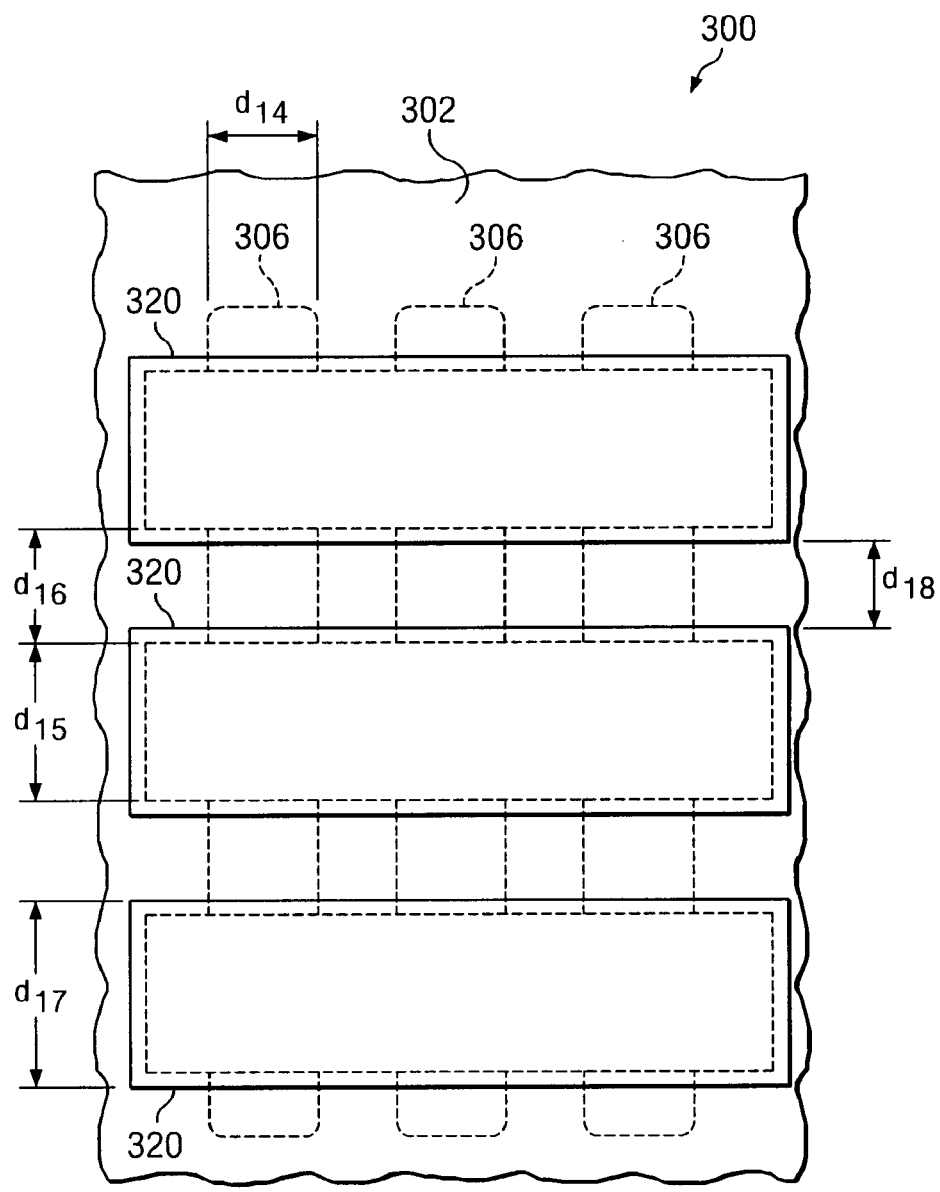
FIG. 19 shows a top view of the semiconductor device shown in FIG. 18.
Figure 20:
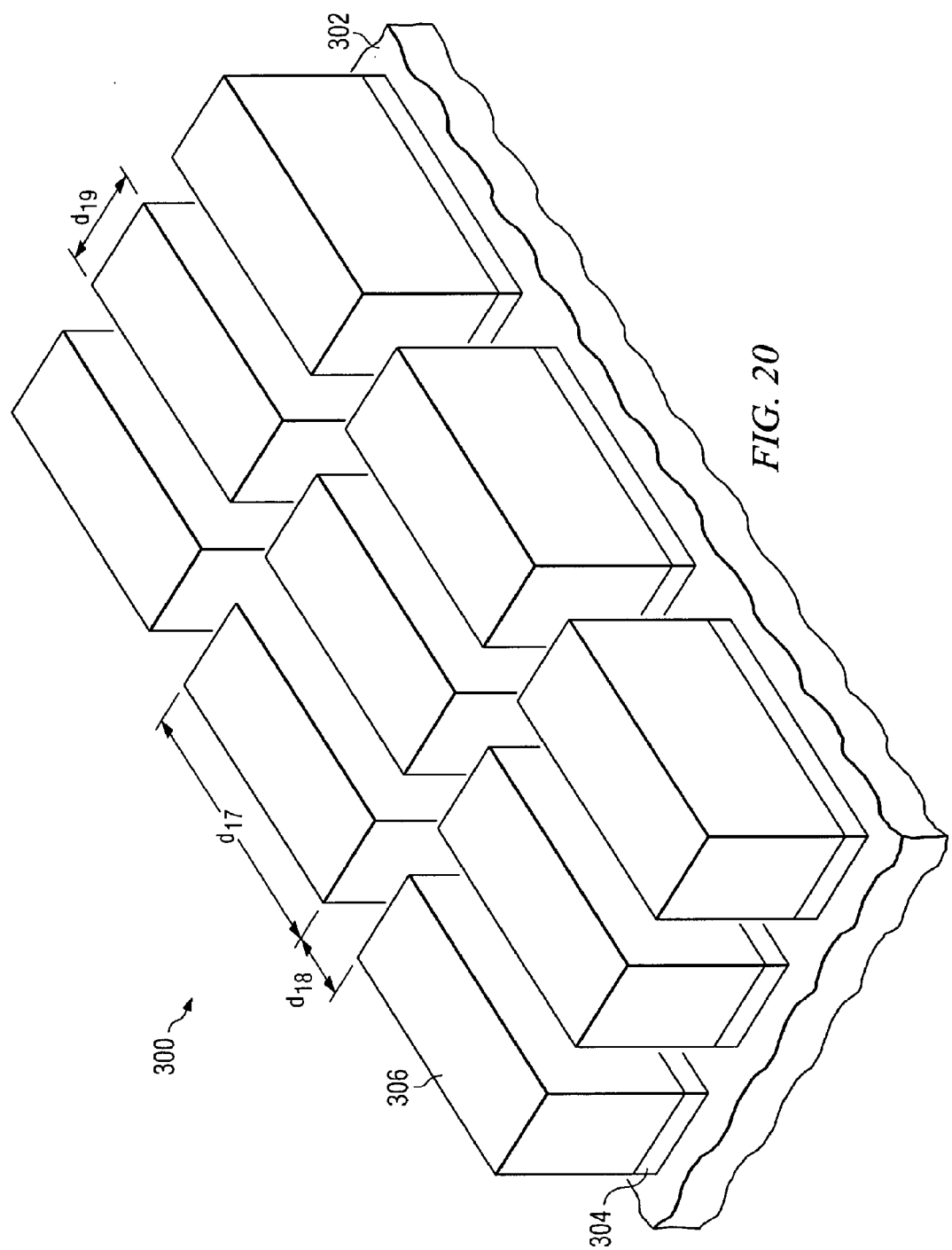
FIG. 20 shows a perspective view.
Figure 21:
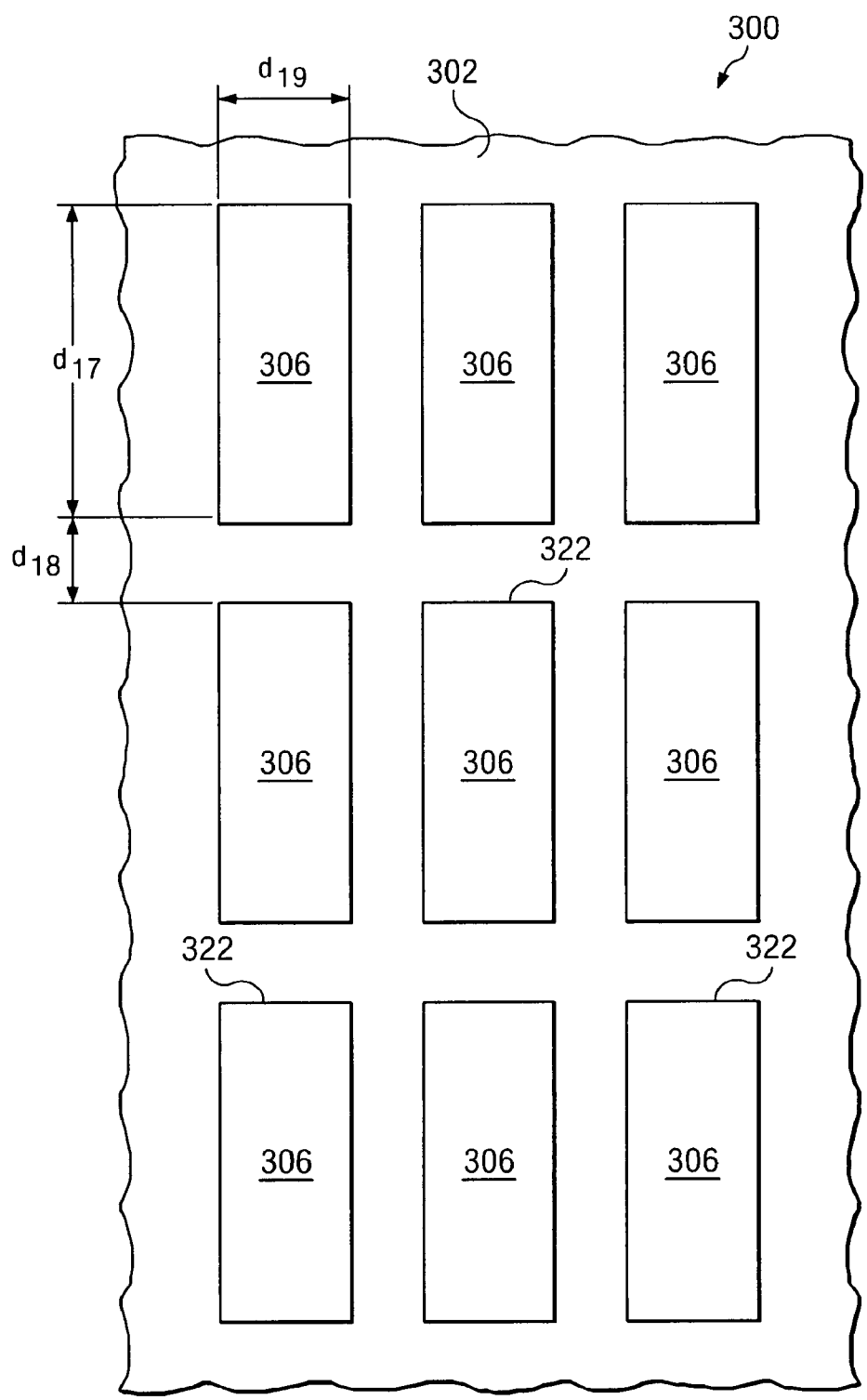
FIG. 21 shows a top view of a semiconductor device that has been patterned using the lithography masks of FIGS. 14 and 15 and the method illustrated in FIGS. 16 through 19.

FIGS. 16 through 18 show perspective views of a method of patterning a plurality of gates using the lithography masks 301a and 301b of FIGS. 14 and 15 in accordance with a preferred embodiment of the present invention. FIG. 16 shows a first masking material 310a/314a comprising an anti-reflective coating 310a disposed over a gate material 306 and a photosensitive material 314a disposed over the anti-reflective coating 310a, after the first lithography mask 301a of FIG. 14 has been used to pattern the first masking material 310a/314a, and after the first masking material 310a/314a has been used to pattern the gate material 306 and the gate dielectric material 304, defining the widths of the gates 306. Note that the smaller sides of the gates 306 are often referred to in the art as a "gate length." However, for purposes of this discussion, the smaller sides of the gates 306 are referred to herein as widths. The widths of the gate material 306 and the gate dielectric material 304 comprise substantially the same dimension $d_{14}$ (also dimension $d_{19}$ in FIG. 21) as the widths of the patterns on the first lithography mask 301a, e.g., divided by the reduction factor.

Next, the first masking material 310a/314a is removed, and then a second masking material 310b/314b is formed over the width-patterned gate material 306 and gate dielectric material 304, as shown in FIG. 17 in a perspective view. The upper portion of the second masking material 314b is patterned using the second lithography mask 301b shown in FIG. 15, as shown.

A polymer material 320 preferably comprising similar materials and thickness as polymer material 220 shown in FIGS. 10 through 12 is deposited or formed over the exposed portions of the workpiece 302. The polymer material 320 is formed over the patterned second masking material 314b and over exposed portions of the second anti-reflective coating 310b comprising the lower portion of the second masking material 310b/314b, similar to the second embodiment previously described herein, as shown in FIG. 18 in a perspective view and in FIG. 19 in a top view. The polymer material 320 coats the patterned photosensitive material 314b, and preferably an etch process is used to open the anti-reflective coating 310b that is anisotropic and leaves the polymer material 320 on the sidewalls of the patterned photosensitive material 314b.

The polymer material 320 enlarges the patterns of the second masking material 310b/314b to lengths comprising a dimension $d_{17}$, e.g., which lengths $d_{17}$ are longer compared to the patterns 305b on the second lithography mask 301b defining the lengths of the gate comprising dimension $d_{15}$ shown in FIG. 15. The second masking material 310b/314b and the polymer material 320 are used as a mask while the gate material 306 and gate dielectric material 304 are patterned, leaving the structure shown in a perspective view in FIG. 20 and shown in a top view in FIG. 21. The tip-to-tip distance $d_{18}$ of the gates 306 has been reduced, compared to dimension $d_{16}$ on the second lithography mask 301b (see FIG. 15), e.g., by an amount substantially equal to twice the thickness of the polymer material 320.

Thus, using a two-step etch process, two lithography masks 301a and 301b, and two masking materials 310a/314a and 310b/314b, the vertical and horizontal ends of the material layer 304/306 to be patterned may be defined and patterned, wherein the length-wise distance between gates, the tip-to-tip distance, and line end shortening is reduced by the additional deposition step of the polymer material 320, before the step of opening the anti-reflective coating 310b of the masking material 310b/314b used for the patterning of the second lithography mask 310b. Advantageously, because the "cutter mask" 301b comprises a pattern that is substantially rectangular, the ends of the transistor gates 306 may comprise flat or squared edges 322, which may be advantageous in some applications, for example.

In accordance with the third embodiment of the present invention, a method of manufacturing a semiconductor device 300 preferably comprises providing a workpiece 302 as shown in FIG. 16, and forming a material layer such as gate material 306 (and optionally also gate dielectric material 304) over the workpiece 302. A first anti-reflective coating 310a is formed over the workpiece 302, and a first photosensitive material 314a is formed over the first anti-reflective coating 310a. An optional first ODL may be disposed over the gate material 306 before the first anti-reflective coating 310a is formed, if a tri-layer resist is used, for example, not shown.

The first photosensitive material 314a and the first anti-reflective coating 310a are exposed using the first lithography mask 301a, wherein the first lithography mask 301a comprises a first portion 305a of a pattern. The first photosensitive material 314a is developed, forming the first portion 305a of the pattern in the first photosensistive material 314a. The method includes using the first photosensitive material 314a and/or the first anti-reflective coating 310a as a mask to form the first portion 305a of the pattern in the material layer 306, as shown in FIG. 16.

The first photosensitive material 314a and the first anti-reflective coating 310a are removed, and a second anti-reflective coating 310b is formed over the patterned material layer 306 and exposed portions of the workpiece 302, as shown in FIG. 17. A second photosensitive material 314b is disposed over the second anti-reflective coating 310b. An optional second ODL may be formed before the second anti-reflective coating 310b is formed, if a tri-layer resist is used, for example, not shown.

The second photosensitive material 314b is exposed using a second lithography mask 301b, the second lithography mask 301b comprising a second portion 305b of a pattern, the second portion of the pattern 305b comprising a different pattern than the first portion 305a of the pattern of the first lithography mask and intersecting in regions with the first portion 305a of the pattern. The second photosensitive material 314b is developed, forming the second portion 305b of the pattern in the second photosensistive material 314b, also shown in FIG. 17.

The polymer material 320 is formed over the patterned second photosensitive material 314b and over exposed portions of the second anti-reflective coating 310b, as shown in FIG. 18. Portions of the second anti-reflective coating 310b are etched using the polymer material 320 and the patterned second photosensitive material 314b as a mask, using a directional, anisotropic etch process. The polymer material 320 and the patterned second photosensitive material 314b and/or the patterned second anti-reflective coating 310b are then used as a mask to pattern the material layer 306 of the workpiece 302 with an enlarged second portion 305b of the pattern.

The first embodiment previously described herein may also be used in combination with the third embodiment. For example, the anisotropic etch process used to etch the second anti-reflective coating 310b using the polymer material 320 and the second photosensitive material 314b may include a redeposition component (such as 117 described for FIGS. 1 through 7) that forms on sidewalls of the second anti-reflective coating 310b during the etch process. Patterning the material layer 306 in this embodiment may further comprise using the redeposition component 117 as a mask during the patterning. The redeposition component 117 further enlarges the second portion 305b of the pattern transferred to the material layer from the second lithography mask 301b in this embodiment, advantageously further reducing line end shortening and decreasing the tip-to-tip distance between transistor gate ends.

Furthermore, in the third embodiment, a tapered profile may be intentionally introduced during the etch process to pattern the second portion 305b of the pattern, to further reduce the tip-to-tip distance $d_{18}$ without having an impact on the gate line (e.g., width or dimension $d_{19}$ shown in FIG. 21) profile, advantageously, because the widths of the gates 306 are masked during the etching of the gate lengths. The tapered profile may be introduced during the final etch process of the gate material 306, for example. The line ends of the gates 306 may be narrower at the top than at the bottom proximate the workpiece 302 in these embodiments, so that the gate length at the bottom of the gates 306 is increased and the tip-to-tip distance is decreased, for example, not shown.

Note that in the third embodiment, the order of the masks 301a and 301b may be reversed: the second lithography mask 301b may be used to pattern the semiconductor device 300 first with the line end-defining patterns 305b and using the polymer material 320 to enlarge the patterns 305b, and then the first lithography mask 310a may be used to pattern the semiconductor device 300 with the gate width-defining patterns 305a.

Embodiments of the present invention have been described herein for applications that utilize a positive photoresist, wherein the patterns transferred to the photoresist and also the material layer comprise the same patterns on the lithography mask. Embodiments of the present invention may also be implemented in applications where a negative photoresist is used, e.g., wherein the patterns transferred to the photoresist and the material layer comprise the reverse image of the patterns on the lithography mask.

The novel lithography methods and semiconductor device 100, 200, and 300 manufacturing methods described herein may be used to fabricate many types of semiconductor devices 100, 200, and 300, including memory devices and logic devices, as examples, although other types of semiconductor devices 100, 200, and 300, integrated circuits, and circuitry may be fabricated using the novel embodiments of the present invention described herein. Embodiments of the present invention may be implemented in lithography systems using light at wavelengths of 248 nm or 193 nm, for example, although alternatively, other wavelengths of light may also be used.

The lithography masks 101, 201, 301a, and 301b described herein may comprise binary masks, phase-shifting masks, attenuating masks, dark field, bright field, transmissive, reflective, or other types of masks, as examples.

Advantages of embodiments of the invention include providing several methods for reducing line end shortening and reducing the tip-to-tip distance (e.g., the space between ends of elongated features). Features that are denser than the patterns on lithography masks may advantageously be manufactured using the novel methods described herein. Some embodiments involve the use of an etch process with a redeposition component 117, requiring few manufacturing and process changes to implement. Other embodiments require an additional deposition step (e.g., of polymer materials 220 and 320) and the use of an anisotropic etch process to ensure that a portion of the polymer materials 220 and 320 remain on sidewalls of the photosensitive materials 214 and 314b during the anti-reflective coating 210 and 310b open step.

Excellent control and reduction of the tip-to-tip distance may be achieved by the use of the novel embodiments of the invention described herein. Many combinations of the embodiments described herein may be implemented to achieve a desired line end shortening reduction or elimination, or a reduced tip-to-tip distance, for example. Tip-to-tip distances that are smaller than the resolution limits of the optical lithography equipment and systems used to pattern the material layers 106, 206, and 306 may be achieved by the novel methods described herein.

An unexpected result or advantage of the second and third embodiments described herein that utilize an intentionally deposited polymer material 220 and 320 introduced before the anti-reflective coating 210 and 310b open step is a reduction in the line end roughness (LER), due to the presence of the polymer material 220 and 320 during the etch process to pattern the gate material 206 and 306, for example. A 10 to 20% decrease in LER near the tops of gates 206 and 306 and a 5 to 8% decrease in LER near the bottoms of gates 206 and 306 (e.g., proximate the workpiece 202 or 302) after the etch process used to pattern the gates 206 and 306 was observed in experimental test results, for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
    forming a polysilicon material layer over a workpiece;
    forming a first anti-reflective coating over the polysilicon material layer;
    disposing a first photosensitive material over the first anti-reflective coating;
    exposing the first photosensitive material and the first anti-reflective coating using a first lithography mask, the first lithography mask comprising a first pattern;
    forming the first pattern in the first photosensitive material;
    transferring the first pattern in the polysilicon material layer;
    removing the first photosensitive material and the first anti-reflective coating;
    forming a second anti-reflective coating directly over the polysilicon material layer patterned with the first pattern;
    disposing a second photosensitive material over the second anti-reflective coating;
    exposing the second photosensitive material using a second lithography mask, the second lithography mask comprising a second pattern, the second pattern comprising a different pattern than the first pattern;
    forming the second pattern in the second photosensitive material;
    forming a polymer material along sidewalls of the second pattern forming a second extended pattern;

etching the second extended pattern in the second anti-reflective coating; and transferring the second extended pattern in the polysilicon material layer, the polysilicon material layer patterned with the first pattern and the second extended pattern.

2. The method according to claim 1, wherein the first lithography mask comprises a lithography mask for a plurality of elongated transistor gates, and wherein the second lithography mask comprises a cutter lithography mask adapted to form transistor gates.

3. The method according to claim 2, wherein the transistor gates comprise a higher decreased line end roughness at tops of the transistor gates relative to bottoms of the transistor gates.

4. The method according to claim 1, wherein the polymer material decreases a tip-to-tip distance between adjacent ends of transistor gates formed in the polysilicon material layer.

5. The method according to claim 4, wherein a length of the transistor gates formed in the polysilicon material layer is greater than a length of a pattern in the second lithography mask by about twice a thickness of the polymer material.

6. The method according to claim 1, wherein etching comprises an anisotropic etch process, wherein the anisotropic etch process includes a redeposition component that forms on sidewalls of the second anti-reflective coating during the anisotropic etch process, wherein transferring the second extended pattern in the polysilicon material layer further comprises using the redeposition component as the mask, and wherein the redeposition component further enlarges the second extended pattern transferred to the polysilicon material layer from the second lithography mask.

7. The method according to claim 1, further comprising introducing a tapered profile to the polysilicon material layer when using the polymer material and at least one of the patterned second photosensitive material and/or the patterned second anti-reflective coating as a mask to pattern the polysilicon material layer.

8. The method according to claim 1, wherein forming the polymer material comprises using $C_4F_8$ gas chemistry.

9. The method according to claim 1, wherein the first photosensitive material or the second photosensitive material is a tri-layer resist.

10. The method according to claim 1, wherein transferring the second extended pattern in the polysilicon material comprises decreasing a line end roughness of the polysilicon material.

11. A method of manufacturing a semiconductor device, the method comprising:

forming a semiconductive gate material layer over a workpiece;

disposing a first photosensitive material over the semiconductive gate material layer;

patterning the first photosensitive material using a first lithography mask, the first lithography mask comprising a first pattern;

using the first patterned photosensitive material as a mask to form the first pattern in the semiconductive gate material layer;

removing the first patterned photosensitive material;

forming an anti-reflective coating directly over the patterned semiconductive gate material layer;

disposing a second photosensitive material over the anti-reflective coating;

exposing the second photosensitive material using a second lithography mask, the second lithography mask comprising a second pattern, the second pattern comprising a different pattern than the first pattern;

forming the second pattern in the second photosensitive material;

forming a polymer material over the second pattern forming an second extended pattern;

and transferring the second extended pattern through the anti-reflective coating in the patterned semiconductive gate material layer.

12. The method according to claim 11, wherein forming the polymer material comprises conformally depositing the polymer material.

13. The method according to claim 11, wherein forming the polymer material comprises using $C_4F_8$ gas chemistry or $C_xH_yF_z$ gas chemistry.

14. The method according to claim 11, wherein forming the polymer material comprises forming the polymer material up to a thickness of about 20 nm or less.

15. The method according to claim 11, wherein the anti-reflective coating comprises an organic material.

16. The method according to claim 11, wherein transferring the second extended pattern in the patterned semiconductive gate material layer comprises forming transistor gates, and wherein forming transistor gates comprises decreasing a line end roughness of the transistor gates.

17. The method according to claim 16, wherein the transistor gates comprise a higher decreased line end roughness at tops of the transistor gates relative to bottoms of the transistor gates.

18. A method of manufacturing a semiconductor device, the method comprising:

forming a polysilicon material layer over a workpiece;

disposing a first photosensitive material over the polysilicon material layer;

patterning the first photosensitive material using a first lithography mask, the first lithography mask comprising a first pattern;

using the first patterned photosensitive material as a mask to form the first pattern in the material layer;

removing the first patterned photosensitive material;

forming an anti-reflective coating directly over the patterned polysilicon material layer;

disposing a second photosensitive material over the anti-reflective coating;

exposing the second photosensitive material using a second lithography mask, the second lithography mask comprising a second pattern, the second pattern comprising a different pattern than the first pattern;

forming the second pattern in the second photosensitive material;

forming a polymer material over the second pattern forming an second extended pattern; and transferring the second extended pattern through the anti-reflective coating in the patterned polysilicon material layer.

19. The method according to claim 18, wherein forming the polymer material comprises using $C_4F_8$ gas chemistry or $C_xH_yF_z$ gas chemistry.

20. The method according to claim 18, wherein the anti-reflective coating comprises an organic material.

21. The method according to claim 18, wherein transferring the second extended pattern in the patterned polysilicon material layer comprises forming transistor gates, and wherein forming transistor gates comprises decreasing a line end roughness of the transistor gates.

22. The method according to claim 21, wherein the transistor gates comprise a higher decreased line end roughness at tops of the transistor gates relative to bottoms of the transistor gates.

\* \* \* \* \*